(12) United States Patent
Isobe

(10) Patent No.: US 7,193,425 B2
(45) Date of Patent: Mar. 20, 2007

(54) SEMICONDUCTOR TEST DEVICE

(75) Inventor: Katsumi Isobe, Kanagawa (JP)

(73) Assignee: Advantest Corporation, Tokyo (JP)

( * ) Notice: Subject to any disclaimer, the term of this patent is extended or adjusted under 35 U.S.C. 154(b) by 218 days.

(21) Appl. No.: 10/935,894

(22) Filed: Sep. 8, 2004

(65) Prior Publication Data

US 2005/0030069 A1   Feb. 10, 2005

Related U.S. Application Data

(63) Continuation of application No. PCT/JP03/02723, filed on Mar. 7, 2003.

(30) Foreign Application Priority Data

Mar. 8, 2002   (JP) .............................. 2002-063427

(51) Int. Cl.
  *G01R 31/02* (2006.01)
(52) U.S. Cl. .................. 324/763; 330/255; 330/263
(58) Field of Classification Search ............... None
  See application file for complete search history.

(56) References Cited

U.S. PATENT DOCUMENTS

| | | | | |
|---|---|---|---|---|
| 4,240,040 A | * | 12/1980 | Saari | 330/255 |
| 5,467,035 A | * | 11/1995 | Ohi et al. | 327/94 |
| 5,646,576 A | * | 7/1997 | Feldt et al. | 330/263 |
| 6,163,216 A | * | 12/2000 | Murray et al. | 330/255 |

FOREIGN PATENT DOCUMENTS

| | | |
|---|---|---|
| JP | 62-116273 | 5/1987 |
| JP | 2-140676 | 5/1990 |
| JP | 4-131777 | 5/1992 |
| JP | 4-188087 | 7/1992 |
| JP | 11-326458 | 11/1999 |

OTHER PUBLICATIONS

Patent Abstracts of Japan, Publication No. 11-326458 dated Nov. 26, 1999, 1 pg.
Patent Abstracts of Japan, Publication No. 04-188087 dated Jul. 6, 1992, 1 pg.
Patent Abstracts of Japan, Publication No. 04-131777 dated May 6, 1992, 1 pg.
Patent Abstracts of Japan, Publication No. 02-140676 dated May 30, 1990, 1 pg.
Patent Abstracts of Japan, Publication No. 62-116273 dated May 27, 1987, 1 pg.

* cited by examiner

*Primary Examiner*—Ha Tran Nguyen
*Assistant Examiner*—Richard Isla-Rodas
(74) *Attorney, Agent, or Firm*—Osha Liang LLP

(57) ABSTRACT

The present invention provides a semiconductor test device that can output a higher voltage as a driver output without increasing power consumption of a high-speed driver, so as to test a device under test. In order to achieve this, the semiconductor test device for switching a driver output between a plurality of voltages and a higher voltage that is higher than said plurality of voltages and outputting said driver output to test a device under test, includes: a first buffer portion operable to output said plurality of voltages by a push-pull circuit of an emitter follower serving as a source and an emitter follower serving as a sink; and a second buffer portion operable to output said higher voltage by a push-pull circuit of said emitter follower serving as said sink of said first buffer portion and an emitter follower serving as a source of said higher voltage.

9 Claims, 5 Drawing Sheets

SEMICONDUCTOR TEST DEVICE

The present application is a continuation application of PCT/JP03/02723 filed on Mar. 7, 2003 which claims priority from a Japanese patent application No. 2002-063247 filed on Mar. 8, 2002, the contents of which are incorporated herein by reference.

FIELD OF THE INVENTION

The present invention relates to a semiconductor test device that can switch a driver output between a plurality of high-speed test voltages and a voltage that is higher than those voltages to output the driver output, thereby testing a device under test.

RELATED ART

For an exemplary conventional technique, the structure and operation are described referring to FIGS. 3–5.

First, for an exemplary semiconductor test device, its structure and an operation in a logical test are described referring to a block diagram of FIG. 3, showing the main part of that semiconductor test device.

The main part of the semiconductor test device includes a timing generator 4, a pattern generator 5, a waveform shaping unit 6, a logical comparator 7, a driver 8 and a comparator 9.

The semiconductor test device tests a DUT 90 that is a device under test.

The pattern generator 5 generates a logical pattern in synchronization with a basic clock signal output from the timing generator 4 and also generates an expected value.

The waveform shaping unit 6 shapes the logical pattern from the pattern generator and a clock signal from the timing generator 4 so as to obtain a test pattern waveform.

The test pattern is an address signal at a test rate, a clock, or a control signal such as a write signal or a read signal, for example, that is applied to the device under test.

The test signal having a logical level output from the waveform shaping unit 6 is amplified to have a predetermined test voltage level by the driver 8. The amplified test signal is output to an input pin of the DUT 90.

An output signal from an output pin of the DUT 90 is subjected to voltage comparison by the comparator 9, so that a comparison result is output as a logical signal.

In the logical comparator 7, at a timing of a strobe signal from the timing generator 4, logical comparison is performed for the logical output signal from the DUT 90 and the expected value from the pattern generator 5, thereby determining pass or fail.

Next, for a specific circuitry of the semiconductor test device that switches a driver output between a plurality of high-speed test voltages, i.e., a high voltage (VH) and a low voltage (VL), and a high-high voltage (VHH>VH) higher than those test voltages and outputs the driver output, the structure and operation are described referring to FIG. 4.

For example, high-speed voltages, i.e., a high voltage (VH=8V) and a low voltage (VL=−3V) at a rate of several ten megahertz and a high-high voltage (VHH=15V) at a relatively low rate of 1 MHz are switched to be output.

As shown in FIG. 4, a driver circuit that can output a high voltage is formed by current switches 10, 11, diode bridges 20, 21, a buffer portion 40, an amplifier A, switches S1, S2 and an output resistor R.

Please note that a protection resistor or the like is omitted in FIG. 4 in order to simplify the diagram and description.

The current switches 10, 11 are switch means each of which receives a test signal of a logical level from the waveform shaping unit 6. When the logical level is high, each current switch 10, 11 allows a bias current of a constant current source to flow toward a transistor Ta. When the logical level is low, each current switch 10, 11 allows the bias current from the constant current source to flow toward a transistor Tb.

Each of the diode bridges 20, 21 is a voltage setting means for, when a constant current flows in that diode bridge, outputting a constant voltage (VH/VL) at one end of that diode bridge as a voltage Vd at a corresponding end, i.e., an input voltage Vd to the buffer portion 30.

The buffer portion 30 includes constant current sources 31, 32, diodes 33, 34 and transistors 35, 36 that form together a push-pull circuit of an emitter follower.

The constant current sources 31, 32 supplies large constant currents, for the diodes 33, 34 providing biases and for charging/discharging by stray capacitances and parasitic capacitances of the transistors 35, 36, thereby achieving a high-speed driver operation.

An idling current of each transistor 35, 36 is determined by a voltage of the corresponding diode 33, 34. By making the idling currents of the transistors 35, 36 larger, a high-speed transistor operation is achieved.

In other words, if a load current becomes significantly small, an idling current of an appropriate magnitude (for example, 10 mA to 25 mA) is allowed to flow through the transistors 35, 36, thereby suppressing fluctuation in output impedance of the buffer portion 30 to a small value.

A voltage Vd is supplied to a device under test via the push-pull current buffer circuit that forms an emitter follower.

The amplifier A outputs a high voltage VH and a high-high voltage VHH that is higher than the high voltage VH in accordance with its setting.

The output resistor R has a resistance value that is matched with impedance of transmission of a test signal to a device under test.

The switches S1, S2 are means for switching a voltage applied to a device under test between ON (make) and OFF (brake), and is formed by a reed relay, for example.

Next, an operation for outputting a test signal from the driver circuit to a device under test is described referring to a timing chart of FIG. 5.

The switch S1 is turned ON and the switch S2 is turned OFF, high-speed voltages, i.e., a high voltage VH and a low voltage VL are output from the buffer portion 30 to correspond to a test signal.

In a case of switching the driver output from the high-speed test voltages, i.e., the low voltage VL and the high voltage VH, to a high-high voltage VHH that is higher than the high voltage VH so as to output the high-high voltage VHH, the set voltage of the amplifier A is set to the same voltage as the high voltage VH, and then the high voltage VH is output while the switch S1 is ON and the switch S2 is OFF. Then, the switch S2 is turned ON. After a time in which the switch S2 is switched has passed, the switch S1 is turned OFF.

Then, after a time in which the switch S1 is turned OFF has passed while the switch S2 is ON, the set voltage of the amplifier A is changed from the high voltage VH to the high-high voltage VHH.

To the contrary, in a case where the output voltage is changed from the high-high voltage VHH to the low voltage VL, a reverse procedure of the above procedure is performed and the operation is similar. Therefore, the description for this case is omitted.

As described above, in the driver circuit of the conventional semiconductor test device, a time for changing the output voltage from the low voltage VL to the high-high voltage VHH is long. Moreover, if a separate operational amplifier is additionally provided for the higher voltage, the circuit scale becomes larger.

On the other hand, a similar operation can be realized by additionally providing a diode bridge that can set the high-high voltage VHH within the driver circuit, instead of the amplifier A. However, in this case, a power source voltage Vc of the driver circuit has to be set higher than the high-high voltage VHH by about 3V. This increases power consumption in the driver circuit, because the constant currents in the current switch and buffer portion and the idling currents in the transistors 35, 36 are large in order to achieve a high-speed operation of the driver circuit. Therefore, provision of the additional diode bridge is not preferable.

SUMMARY OF THE INVENTION

The present invention is made considering the aforementioned problems, and it is an object of the present invention to provide a semiconductor test device that can output a higher voltage as a driver output without increasing power consumption in a high-speed driver, so as to test a device under test.

According to the first aspect of the present invention, a semiconductor test device for switching a driver output between a plurality of voltages and a higher voltage that is higher than the plurality of voltages and outputting the driver output to test a device under test, comprises: a first buffer portion operable to output the plurality of voltages by a push-pull circuit of an emitter follower serving as a source and an emitter follower serving as a sink; and a second buffer portion operable to output the higher voltage by a push-pull circuit of the emitter follower serving as the sink of the first buffer portion and an emitter follower serving as a source of the higher voltage.

According to the second aspect of the present invention, in a semiconductor test device as recited in claim 1, different power supply voltages are supplied to the first and second buffer portions.

According to the third aspect of the present invention, in a semiconductor test device as recited in claim 1 or 2, in a case where the plurality of voltages are output, an input voltage of the second buffer portion is clamped to a voltage lower than the plurality of voltages.

According to the fourth aspect of the present invention, in a semiconductor test device as recited in claim 1, 2 or 3, the plurality of voltages output from the first buffer portion are two levels of voltages.

According to the fifth aspect of the present invention, in a semiconductor test devices as recited in claim 1, 2 or 3, the plurality of voltages output from the first buffer portion are three or more levels of voltages.

DETAILED DESCRIPTION OF THE INVENTION

Figure 1:
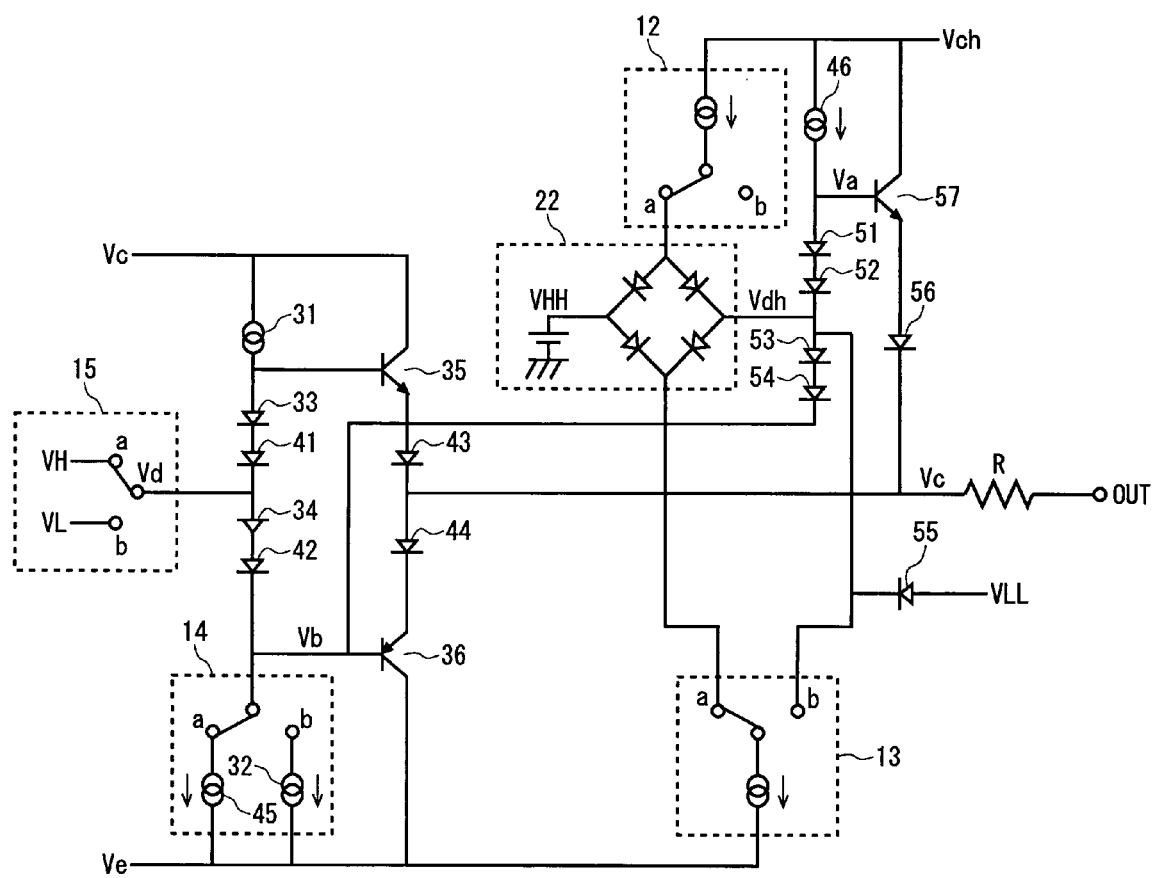
FIG. 1 is a circuit diagram of a driver of a semiconductor test device according to the present invention.
Figure 2:
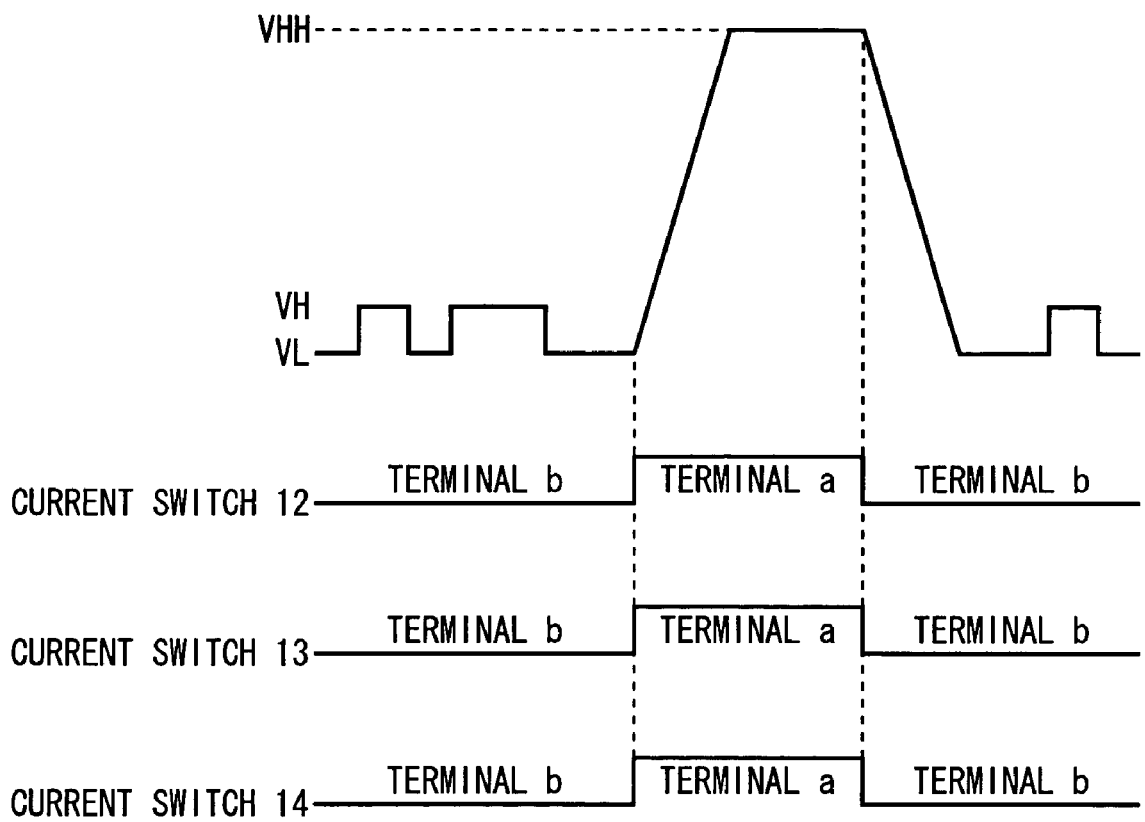
FIG. 2 is a diagram of a driver output waveform of the semiconductor test device according to the present invention.
Figure 3:
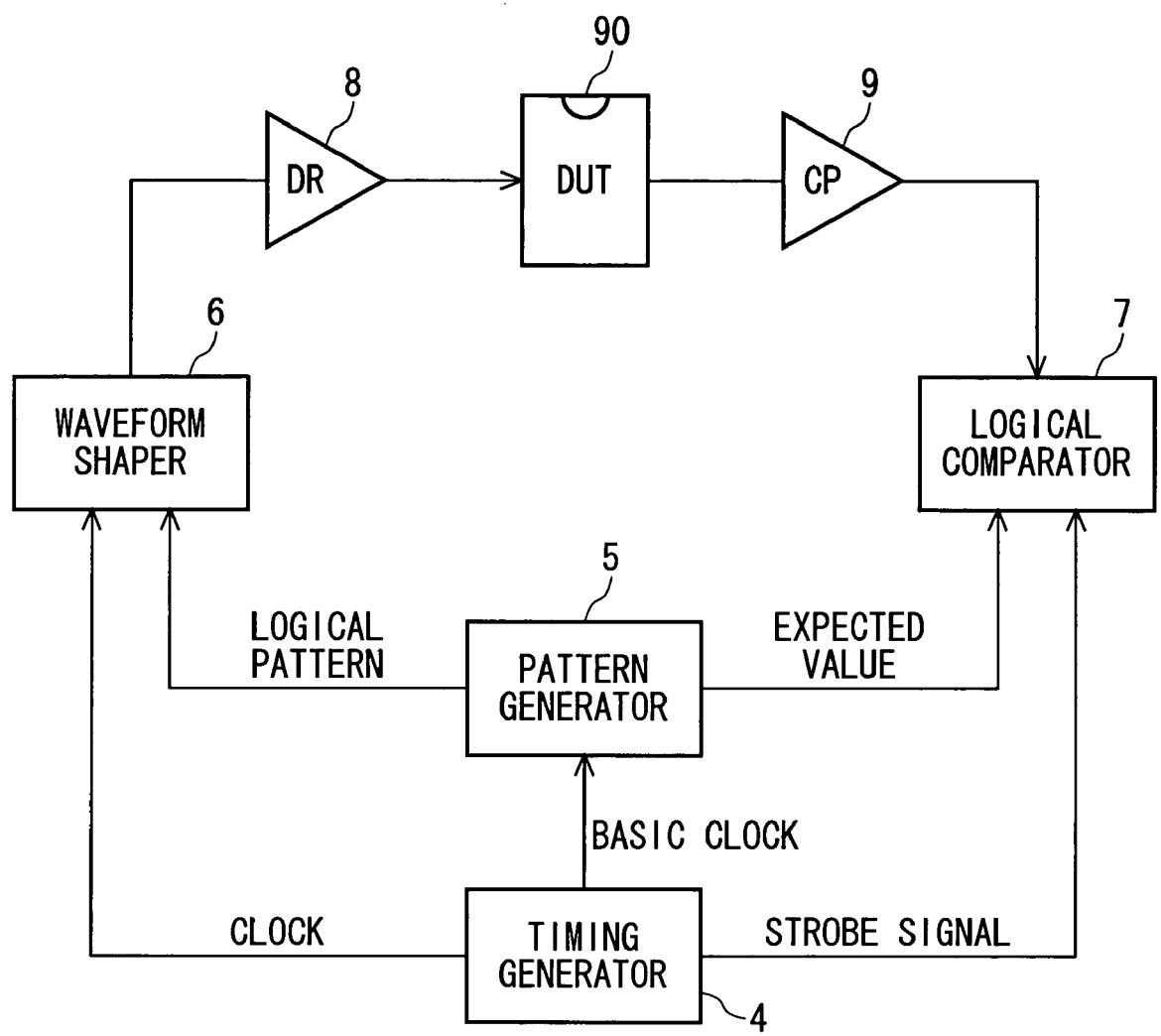
FIG. 3 is a block diagram of the semiconductor test device.

An embodiment of the present invention is described referring to FIGS. 1 and 2.

A general explanation of a semiconductor test device is the same as that of the conventional semiconductor test device that was described in the above. Therefore, the general explanation is omitted.

As for a specific circuit in the semiconductor test device of the present invention, that tests a device under test by switching an output voltage between high-speed test voltages including a high voltage (VH) and a low voltage (VL), and a higher voltage (VHH) that is higher than the high voltage (VH) so as to output the output voltage as a driver output, its structure and operation are described referring to FIG. 1.

As shown in FIG. 1, a driver circuit in the semiconductor test device, that can output the high-high voltage VHH, includes current switches 12, 13, 14, 15, a diode bridge 22, diodes 33, 34, 41, 42, 43, 44, 51, 52, 53, 54, 55, 56, constant current sources 31, 46, transistors 35, 36, 57 and an output resistor R.

Please note that a protection resistor or the like is omitted in FIG. 1 for simplifying the diagram and description.

Among the above-mentioned components, the constant current source 31, the diodes 33, 34, 41, 42, 43, 44, the current switch 14 and the transistors 35, 36 form together the first buffer portion by an emitter follower push-pull circuit that outputs driver voltages VH and VL.

Among the above-mentioned components, the constant current source 46, the diodes 51, 52, 53, 54, 44, 56, the current switch 14 and the transistor 57, 36 form together the second buffer portion by an emitter follower push-pull circuit that outputs a higher driver voltage.

Figure 4:
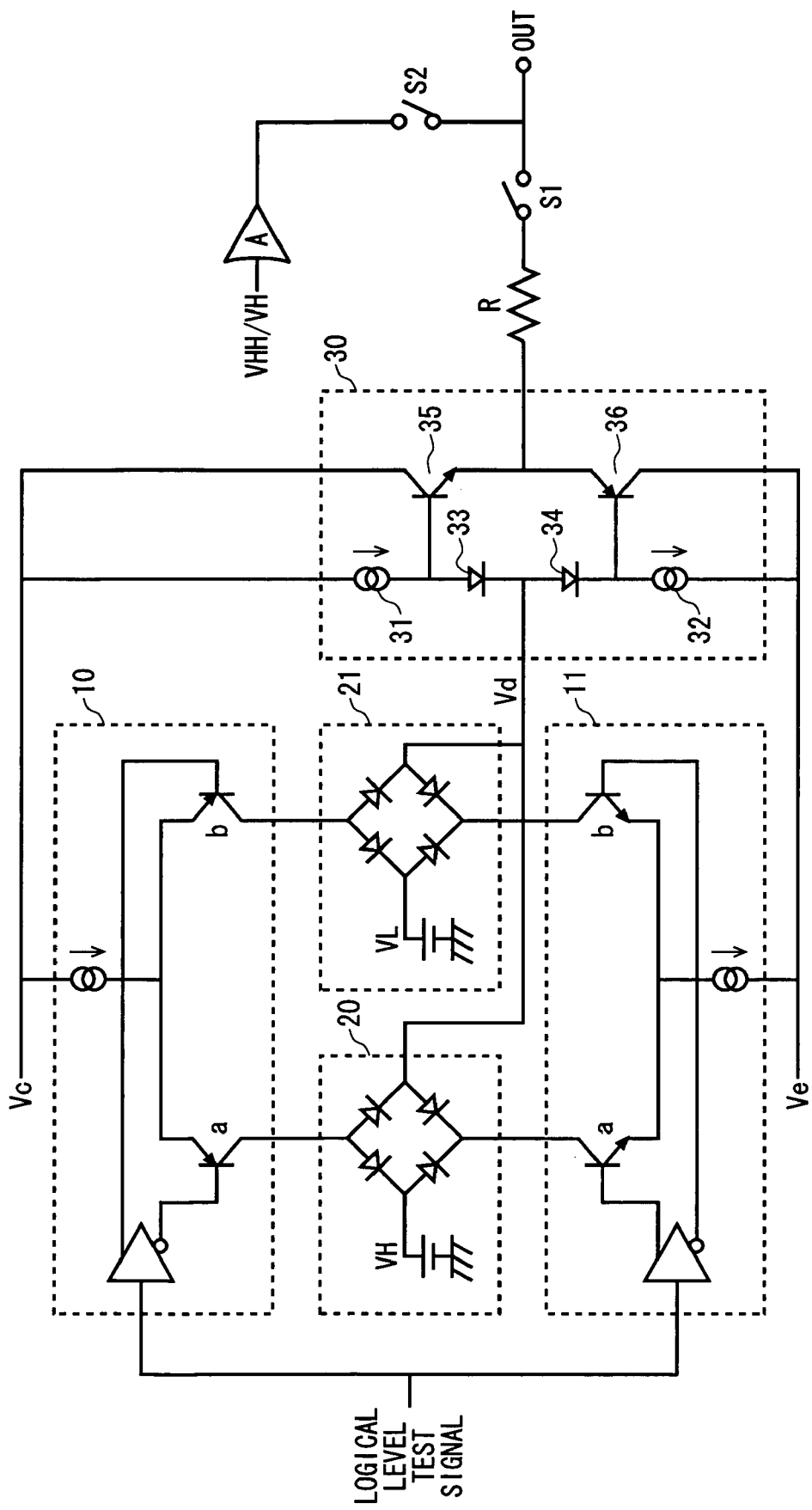
FIG. 4 is a circuit diagram of a driver of a conventional semiconductor test device.
Figure 5:
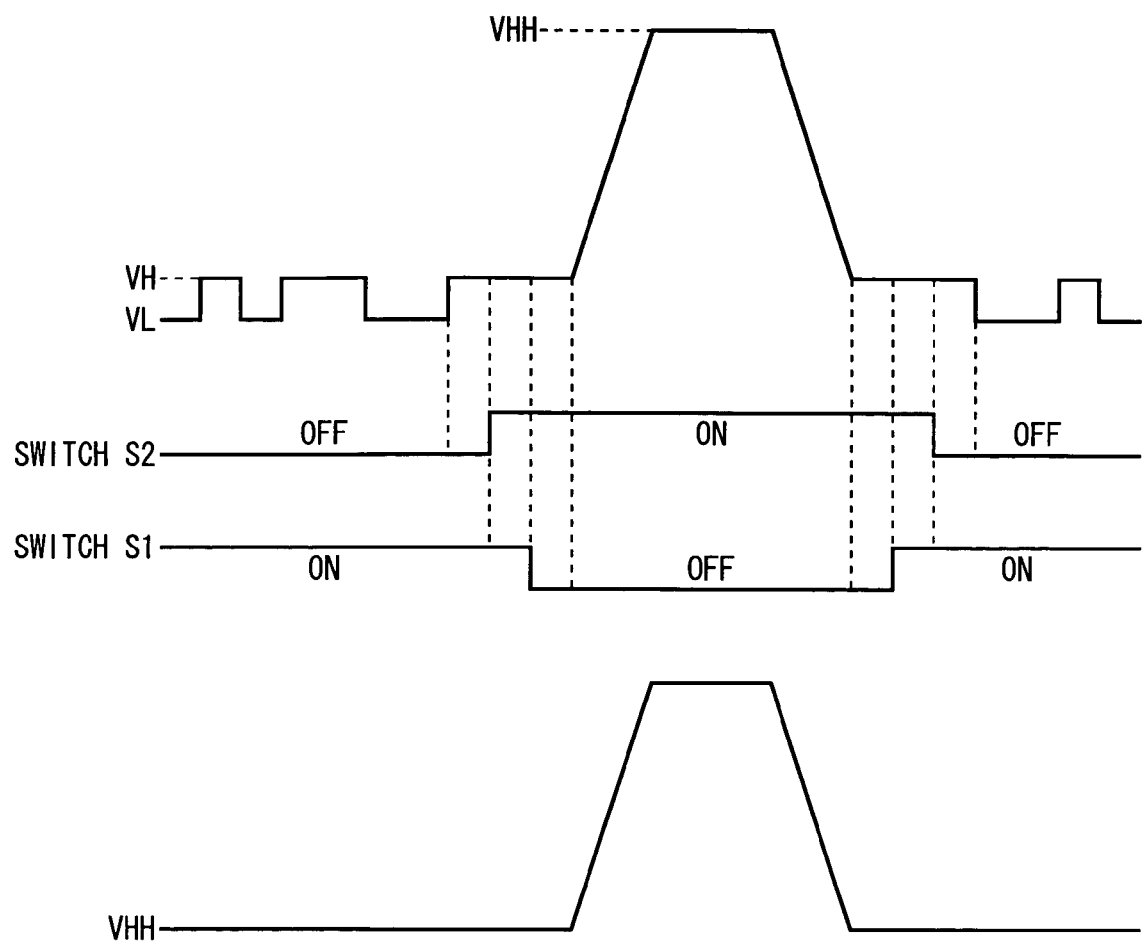
FIG. 5 is a diagram of a driver output waveform of the conventional semiconductor test device.

The current switch 15 represents the current switch 10, 11 and the diode bridge 20, 22 in FIG. 4 that were described for the conventional technique, as one part. The current switch 15 is switched between a terminal a and a terminal b by a test signal, thereby outputting a high voltage VH or a low voltage VL as a voltage Vd.

The current switches 12, 13, 14 are switch means for which switching is controlled by a control signal.

For example, when the logical level of the control signal is high, the current switches 12, 13, 14 are switched to the terminal a. On the other hand, when the logical level of the control signal is low, the current switches 12, 13, 14 are switched to the terminal b.

In a case of outputting the high-speed voltages VH/VL as the driver output, the current switches 12, 13, 14 are switched to the terminal b, respectively.

In a case of outputting the high-high voltage VHH as the driver output, the current switches 12, 13, 14 are switched to the terminal a, respectively.

In the first buffer circuit, diodes 43, 44 are provided for protecting the transistors 35, 36 against breakdown, respectively. Therefore, diodes 41, 42 are also provided on the base sides of the transistors 35, 36.

In a case where the current switch 14 is switched to the terminal b, the first buffer circuit is similar to that described in the description of the conventional technique. Therefore, the description of the operation is omitted.

The diode bridge 22 is a voltage setting means for outputting a setting voltage VHH of the bridge as a voltage Vdh at a corresponding point VHH when a constant current is made to flow in the diode bridge 22.

Constant currents of the constant current sources 45, 46 can be made smaller as compared with the constant current source 31, 32. This is because the buffer portion for the high-high voltage VHH is not required to operate at a high speed typically, and therefore a current for the diodes 51, 52, 53, 54 for applying biases and for charging and discharging by stray capacitances and parasitic capacitances of the transistors 57, 36 can be made small.

The output resistor R has a resistance value that is equal to the impedance of transmission of a test signal to a device under test as in the conventional technique.

The diode 55 is a voltage clamp for setting a voltage lower than the lowest voltage in the buffer circuit for a high-speed driver so as to turn OFF the high-speed driver.

Next, a case where, in order to output the high-high voltage VHH as the driver voltage, the current switches 12, 13, 14 are switched from the terminals b to the terminals a so as to allow an interrupt operation, is described using the following specific voltages.

For example, it is assumed that VH=8V, VL=−3V, VHH=15V, Vc=11B, Ve=−6V, Vch=18V, and a forward voltage of each diode is 0.8V.

First, a case where, in order to the high-speed driver voltages VH/VL as in the conventional technique, the current switches 12, 13, 14 are switched to the terminals b, is described below.

In this case, in order to cut off the diodes 53, 54, 56 so as not to be affected by the buffer portion for the high-high voltage VHH, a voltage VLL for clamping the input voltage Vdh of the buffer portion with the diode 55 is obtained by Expression (1).

$$VLL=VL-(\text{forward voltages of the diode 34 and } 42)=-3V-(0.8V+0.8V)=-4.6V \quad (1)$$

At this time, the diodes 53, 54 applies biases in a reverse direction and are cut off.

Therefore, the input voltage Vdh of the buffer portion for the high-high voltage VHH is obtained as follows.

$$Vdh=-4.6V-0.8V=-5.4V \quad (2)$$

Moreover, a base voltage Va of a transistor is obtained by Expression (2).

$$Va=Vdh+(\text{forward voltages of the diodes 51 and } 52)=-5.4V+1.6V=-3.8V \quad (3)$$

At this time, because the buffer output voltage Vc=−3V, the diode 56 is cut off.

Thus, in a case where the current switches 12, 13, 14 are switched to the terminals b, respectively, the diodes 53, 54, 56 connected to the driver output are cut off. Therefore, the high-voltage driver circuit does not affect on the high-speed driver circuit, and the high-speed driver circuit can operate in a similar manner to that of the conventional driver circuit.

Next, a case where, in order to output the high-high voltage VHH, the current switches 12, 13, 14 are switched to the terminals a, respectively is described.

In this case, because of the diode bridge 22, the voltage Vdh=VHH=15V.

The voltage Vb is obtained by Expression (4).

$$Vb=Vdh-(\text{forward voltages of the diodes 53 and } 54)=15V-1.6V=13.4V \quad (4)$$

At this time, for Vb=13.4V, Vd, Vc and VLL are 8V, 11V and −4.6V, respectively. Therefore, the diodes 34, 42, 43, 55 are cut off.

Thus, the transistor 57 and the transistor 36 forms a push-pull circuit of an emitter follower.

In other words, the second buffer portion for outputting the high-high voltage VHH shares the transistor 36 and the diode 44 with the first buffer portion.

When a voltage at a point Vdh is VHH, the voltage VHH is output to a device under test via the current buffer circuit formed by the push-pull circuit of the emitter follower including the transistors 57 and 36.

Next, an operation for outputting a test signal from the driver circuit to a device under test is described, referring to a timing chart of FIG. 2.

As shown in FIG. 2, the high-speed voltage VH/VL is output as the driver output while the current switches 12, 13, 14 are switched to the terminals b, respectively.

Then, the current switches 12, 13, 14 are switched to the terminals a, respectively, so that the high-high-voltage VHH is output as the driver output.

Then, the current switches 12, 13, 14 are switched to the terminals b, respectively, so that the high-speed voltage VH/VL is output as the driver output.

As described above, in a driver circuit of a semiconductor test device according to the present invention, a bias current is independently provided for a buffer portion for a high-high voltage VHH, a constant current is small as compared with a bias current for a high-speed buffer portion of a constant current source, and a power source voltage of the high-speed driver can be kept low. Thus, the present invention can suppress power consumption to a low level.

Moreover, in the driver circuit of the semiconductor test device according to the present invention, a settling time for setting the output voltage from the high-speed voltage (VH/VL) to the high-high-voltage (VHH) and power consumption can be reduced. In addition, since a relay or the like is not used, the driver circuit is suitable for integration into an IC and can be realized without making the circuit scale larger.

In the above description, the high-speed driver portion is described as a binary driver outputting a high voltage HV and a low voltage VL. However, if the high-speed driver portion is formed as a driver outputting three (VH, VL, VT) or more levels of voltages, in which the third voltage supplying a terminate voltage VT that may be used in comparison with an output signal from a device under test is added, it is not affected by the buffer portion for the high-high voltage VHH. Therefore, the driver outputting three or more levels of voltages can be realized similarly.

For example, such a high-speed driver outputting three or more levels of voltages are disclosed in "Driver circuit (Japanese Patent Application No. 9-93113), and therefore the detailed description thereof is omitted.

The present invention is implemented in forms described above and achieves the following advantages.

In a driver circuit of a semiconductor test device according to the present invention, a settling time from setting an output voltage from a high-speed voltage (VH/VL) to a high-high voltage (VHH) can be reduced, and power consumption can be reduced. Moreover, the driver circuit does not use a relay or the like, and is suitable for integration into an IC. That is, the driver circuit has an advantage that it can be implemented without increasing the circuit scale.

In addition, a high-speed driver portion is described as a binary driver outputting a high voltage VH and a low voltage VL. However, even if the high-speed driver portion is formed to output three or more levels of voltages, it is not affected by a higher-voltage buffer portion. Thus, the driver circuit outputting three or more levels of voltages can be realized in a similar manner.

What is claimed is:

1. A semiconductor test device for switching a driver output between one of a plurality of voltages and a higher voltage that is higher than the highest voltage of said plurality of voltages and outputting said driver output to test a device under test, comprising:
   a first buffer portion operable to output said plurality of voltages by a push-pull circuit of an emitter follower serving as a source and an emitter follower serving as a sink;
   a second buffer portion operable to output said higher voltage by a push-pull circuit of said emitter follower serving as said sink of said first buffer portion and an emitter follower serving as a source of said higher voltage; and
   a switching means for switching which one of the emitter follower serving as a source in the first buffer and the emitter follower serving as a source in the second buffer serves as a source to form the push-pull circuit together with said emitter follower serving as said sink of said first buffer portion.

2. A semiconductor test device as claimed in claim 1, wherein said first and second buffer portions are supplied with different power supply voltages from each other.

3. A semiconductor test device as claimed in claim 2, wherein said plurality of voltages output from said first buffer portion are two levels of voltages.

4. A semiconductor test device as claimed in claim 2, wherein said plurality of voltages output from said first buffer portion are three or more levels of voltages.

5. A semiconductor test device as claimed in claim 1, further comprising a diode for clamping an input voltage of said second buffer portion to a voltage lower than said plurality of voltage in a case where said plurality of voltages are output.

6. A semiconductor test device as claimed in claim 5, wherein said plurality of voltages output from said first buffer portion are two levels of voltages.

7. A semiconductor test device as claimed in claim 5, wherein said plurality of voltages output from said first buffer portion are three or more levels of voltages.

8. A semiconductor test device as claimed in claim 1, wherein said plurality of voltages output from said first buffer portion are two levels of voltages.

9. A semiconductor test device as claimed in claim 1, wherein said plurality of voltages output from said first buffer portion are three or more levels of voltages.

* * * * *